United States Patent [19]

Tsai et al.

[11] Patent Number: 5,728,619

[45] Date of Patent: Mar. 17, 1998

[54] SELECTIVE REACTIVE ION ETCH (RIE) METHOD FOR FORMING A NARROW LINE-WIDTH HIGH ASPECT RATIO VIA THROUGH AN INTEGRATED CIRCUIT LAYER

[75] Inventors: Chia Shiung Tsai; Chen-Hua Douglas Yu, both of Hsin-Chu, Taiwan

[73] Assignee: Taiwan Semiconductor Manufacturing Company, Ltd., Hsin-Chu, Taiwan

[21] Appl. No.: 618,890

[22] Filed: Mar. 20, 1996

[51] Int. Cl.$^6$ .................................................. H01L 21/336
[52] U.S. Cl. .................. 438/297; 438/300; 438/301; 438/721; 438/738
[58] Field of Search ........................ 437/192, 195, 437/200; 438/297, 300, 301, 721, 735

[56] References Cited

U.S. PATENT DOCUMENTS

| | | | |
|---|---|---|---|
| 5,022,958 | 6/1991 | Faveau et al. | 156/643 |
| 5,122,225 | 6/1992 | Douglas | 156/643 |
| 5,200,028 | 4/1993 | Tatsumi | 156/656 |
| 5,206,187 | 4/1993 | Doan et al. | 437/192 |
| 5,278,100 | 1/1994 | Doan et al. | 437/200 |
| 5,391,521 | 2/1995 | Kim | 437/200 |
| 5,627,395 | 5/1997 | Witek et al. | 257/350 |

Primary Examiner—Charles L. Bowers, Jr.
Assistant Examiner—Reneé R. Berry
Attorney, Agent, or Firm—George O. Saile; Stephen B. Ackerman; Alek P. Szecsy

[57] ABSTRACT

A method for forming within an integrated circuit a narrow line-width high aspect ratio via through a first integrated circuit layer which resides upon a second integrated circuit layer. There is first formed upon a semiconductor substrate a second integrated circuit layer which has formed upon its surface a first integrated circuit layer. Through a first etch method, a partial via is then formed within the first integrated circuit layer to a distance of from about 2500 to about 4000 angstroms above the surface of the second integrated circuit layer. The first etch method is chosen to provide a partial via with substantially parallel sidewalls. Through a second etch method, the partial via is then etched completely through the first integrated circuit layer. The second etch method is chosen to possesses an etch selectivity ratio for the first integrated circuit layer with respect to the second integrated circuit layer of at least about 60:1. The method is preferably employed in forming narrow line-width high aspect ratio vias through insulator layers beneath which reside metal silicide layers formed upon integrated circuit device electrodes within integrated circuits.

17 Claims, 5 Drawing Sheets

SELECTIVE REACTIVE ION ETCH (RIE) METHOD FOR FORMING A NARROW LINE-WIDTH HIGH ASPECT RATIO VIA THROUGH AN INTEGRATED CIRCUIT LAYER

BACKGROUND OF THE INVENTION

1. Field of the Invention

The present invention relates generally to integrated circuit layers within integrated circuits. More particularly, the present invention relates to a selective Reactive Ion Etch (RIE) etch method for forming a narrow line-width high aspect ratio via through an integrated circuit layer within an integrated circuit.

2. Description of the Related Art

As integrated circuit technology has advanced, and integrated circuit device and conductor element dimensions have decreased, it has become increasingly important to from through integrated circuit layers within advanced integrated circuits narrow line-width high aspect ratio vias. Such narrow line-width high aspect ratio vias may be formed, for example, through silicon oxide insulator layers which are formed in various locations within advanced integrated circuits. When formed through the first silicon oxide insulator layer within an advanced integrated circuit, such as a Pre-Metal Dielectric (PMD) layer formed of silicon oxide, a narrow line-width high aspect ratio via is typically formed in a location which allows interconnection of: (1) a narrow line-width integrated circuit device electrode formed within a portion of a semiconductor substrate exposed by the narrow line-width high aspect ratio via, and (2) a narrow line-width patterned conductor element separated from the narrow line-width integrated circuit device electrode by the Pre-Metal Dielectric (PMD) layer.

There are several features of narrow line-width high aspect ratio vias which in conjunction with associated features of narrow line-width integrated circuit device electrodes and narrow line-width conductor elements assist in forming functional and reliable integrated circuits within which reside those narrow line-width high aspect ratio vias, narrow line-width integrated circuit device electrodes and narrow line-width conductor elements. Included among, but not limiting of, the features are: (1) the taper of the narrow line-width high aspect ratio via, and (2) the contact resistance of the surface to which connection is made through the narrow line-width high aspect ratio via.

With regard to the taper of the narrow line-width high aspect ratio via, it is typically generally undesirable within integrated circuits to form vias with a negative taper (ie: a larger cross-section at the bottom of the via than at the top of the via). In addition, it is also typically undesirable within advanced integrated circuits to form narrow line-width high aspect ratio vias of substantially positive taper. Typically, narrow line-width high aspect ratio vias within advanced integrated circuits are desired to be formed with a slightly positive, if any, taper to allow for efficient filling of the narrow line-width high aspect ratio vias with a conductive interconnection material while simultaneously maintaining adequate separation to provide an optimally high areal density of narrow line-width high aspect ratio vias within the advanced integrated circuit.

With regard to the contact resistance of the surfaces to which connection is made through narrow line-width high aspect ratio vias, it is known in the art that connections directly between narrow line-width integrated circuit device electrodes, and narrow line width conductor elements or narrow line width interconnection elements which connect to those narrow line-width integrated circuit device electrodes through narrow line-width high aspect ratio vias often have undesirably high contact resistances, particularly as the cross-section of the narrow line-width high aspect ratio vias decreases. In order to limit these high contact resistances it is common in the art to form a metal silicide layer upon the narrow line-width integrated circuit device electrode, either prior to or after forming the narrow line-width high aspect ratio via, and the dielectric layer through which is formed the narrow line-width high aspect ratio via, upon the surface of the semiconductor substrate upon which is formed the narrow line-width high aspect ratio via, the narrow line-width integrated circuit device electrode and the narrow line width conductor element or the narrow line width patterned interconnection element. It is known in the art that such metal silicide layers provide lower contact resistances. Common metal silicide layers which may be employed in lowering contact resistances include but are not limited to titanium silicide, tungsten silicide, platinum silicide, cobalt silicide and tantalum silicide layers. Of this group of metal silicide layers, titanium silicide is quite commonly employed in forming metal silicide layers upon the surfaces of narrow line-width integrated circuit device electrodes.

From the foregoing, it is therefore desirable to form through silicon oxide insulator layers within advanced integrated circuits narrow line-width high aspect ratio vias of minimal taper (ie: substantially parallel sidewalls) which expose the surfaces of narrow line-width integrated circuit device electrodes residing beneath those silicon oxide insulator layers, the narrow line-width integrated circuit device electrodes having formed upon their surfaces low contact resistance titanium silicide layers. Most desirable are methods through which such narrow line-width high aspect ratio vias may be formed, which methods have a high etch selectivity ratio for the silicon oxide insulator layer with respect to the titanium silicide layer. It is towards forming within integrated circuits narrow line-width high aspect ratio vias in accord with the foregoing characteristics that the present invention is specifically directed.

Methods and materials through which metal silicide layers may be formed within integrated circuits, and methods and materials through which integrated circuit structures having formed therein metal silicide layers may be subjected to Reactive Ion Etch (RIE) etch processes which exhibit an etch selectivity with respect to the metal silicide layers, are known in the art. For example, Doan et al., in U.S. Pat. No. 5,278,100 disclose a method for forming a uniform titanium silicide layer upon a narrow line-width patterned semiconductor substrate layer through a Chemical Vapor Deposition (CVD) method employing an organo-metallic titanium source material in conjunction with a silane source material. In addition, Kim, in U.S. Pat. No. 5,391,521 discloses a method for forming complementary low contact resistance electrode contact barriers within integrated circuits by employing a material, such as titanium or titanium silicide, exhibiting a low potential barrier to a N+ diffusion layer as a contact for an N+ diffusion layer and a material, such as platinum silicide, exhibiting a low potential barrier to a P+ diffusion layer as a contact for a P+ diffusion layer.

With regard to Reactive Ion Etch (RIE) etch methods which exhibit an etch selectivity with respect to metal silicide layers, Douglass, in U.S. Pat. No. 5,122,225 discloses a Reactive Ion Etch (RIE) etch method for patterning within an integrated circuit a titanium nitride or a titanium oxide layer in the presence of a silicon oxide layer or a titanium silicide layer. The method employs a Reactive Ion Etch (RIE) reactant gas composition which is chosen such that a non-volatile reaction product is formed by etching the silicon oxide layer or the titanium silicide layer with the Reactive Ion Etch (RIE) reactant gas composition while a volatile reaction product is formed when etching the titanium nitride layer or the titanium oxide layer with the Reactive Ion Etch (RIE) reactant gas composition. In addition, Tatsumi, in U.S. Pat. No. 5,200,028 discloses a method for successively and uniformly etching through a Reactive Ion Etch (RIE) etch method the metal silicide and polysilicon layers typically employed in forming a polycide gate electrode within a Metal Oxide Semiconductor Field Effect Transistor (MOSFET). The method employs two successive gaseous mixtures within the Reactive Ion Etch (RIE) etch method, the two mixtures having different ratios of hydrogen bromide and a fluorine radical donating specie.

Most pertinent to the goals towards which the present invention is directed, however, is the disclosure of Taiwan Patent 249295. Taiwan Patent 249295 discloses a method through which a silicon oxide insulator layer in the presence of a titanium silicide layer may be etched with a high etch selectivity ratio of the silicon oxide insulator layer with respect to the titanium silicide layer. The method employs a Reactive Ion Etch (RIE) reactant gas mixture comprising tri-fluoro methane, nitrogen and helium, the associated Reactive Ion Etch (RIE) etch method being employed at a comparatively high Reactive Ion Etch (RIE) reactor chamber pressure of about 0.8 to about 10 torr. While the method does indeed provide the desired high etch selectivity ratio of a silicon oxide insulator layer with respect to a titanium silicide layer in contact with the silicon oxide insulator layer, the method as disclosed in Taiwan Patent 249295 is nonetheless deficient in meeting other goals towards which the present invention is directed. In particular, the method as disclosed in Taiwan Patent 249295 forms within and through silicon oxide insulator layers vias which typically have a substantial positive taper and which typically have substantial Reactive Ion Etch (RIE) etch residue formed therein. In addition, the method as disclosed in Taiwan Patent 249295 typically forms within Reactive Ion Etch (RIE) reactor chambers residues whose removal requires enhanced Preventative Maintenance (PM) schedules.

Thus, there is still desired in the art methods, such as Reactive Ion Etch (RIE) etch methods, through which narrow line-width high aspect ratio vias may be formed through silicon oxide insulator layers in contact with titanium silicide layers within integrated circuits, the Reactive Ion Etch (RIE) methods simultaneously exhibiting a high etch selectivity ratio for the silicon oxide insulator layer with respect to the titanium silicide layer in contact with the silicon oxide layer. In a more general sense, there is desired within integrated circuits a method for forming through a first integrated circuit layer a narrow line-width high aspect ratio via with substantially parallel sidewalls, which method exhibits a high etch selectivity for the first integrated circuit layer with respect to a second integrated circuit layer which resides beneath the first integrated circuit layer. Most preferably, it is desired that the method be undertaken in-situ within a single reactor chamber.

SUMMARY OF THE IN INVENTION

A first object of the present invention is to provide a method for forming within a first integrated circuit layer within an integrated circuit a narrow line-width high aspect ratio via with substantially parallel sidewalls.

A second object of the present invention is to provide a method for forming a narrow line-width high aspect ratio via in accord with the first object of the present invention, which method also has a high etch selectivity ratio for the first integrated circuit layer with respect to a second integrated circuit layer which resides beneath the first integrated circuit layer.

A third object of the present invention is to provide a method in accord with the first object of the present invention and the second object of the present invention, which method may also be undertaken in-situ.

In accord with the objects of the present invention, there is provided a method for forming within an integrated circuit a narrow line-width high aspect ratio via through a first integrated circuit layer which contacts a second integrated circuit layer. To practice the method of the present invention, there is first formed upon a semiconductor substrate a second integrated circuit layer. There is then formed upon the second integrated circuit layer a first integrated circuit layer. Through a first etch method, a partial via is then etched within the first integrated circuit layer to a distance of from about 2500 to about 4000 angstroms above the surface of the second integrated circuit layer. The first etch method is chosen to form the partial via with substantially parallel sidewalls. Through a second etch method, the partial via is then etched completely through the first integrated circuit layer. The second etch method is chosen to provide an etch selectivity ratio for the first integrated circuit layer with respect to the second integrated circuit layer of at least about 60:1.

The present invention provides a method for forming within a first integrated circuit layer within an integrated circuit a narrow line-width high aspect ratio via with substantially parallel sidewalls. By selecting a first etch method which forms a partial via within the first integrated circuit layer with substantially parallel sidewalls, and employing the first etch method for etching the partial via within the first integrated circuit layer to a distance of from about 2500 to about 4000 angstroms above the surface of a second integrated circuit layer which resides beneath the first integrated circuit layer, the partial via when completely etched through the first integrated circuit layer through the second etch method will have substantially parallel sidewalls.

The present invention provides a method for forming a narrow line-width high aspect ratio via within a first integrated circuit layer, which method also has a high etch selectivity ratio of the first integrated circuit layer with respect to a second integrated circuit layer which resides beneath the first integrated circuit layer. The second etch method of the present invention provides an etch method which exhibits an etch selectivity of the first integrated circuit layer with respect to the second integrated circuit layer of greater than about 60:1. Through the method of the present invention, the second etch method is employed in etching the partial via through the remaining 2500 to about 4000 angstroms of the first integrated circuit layer not etched through the first etch method. Thus, the second etch method is employed only at a time during the method of the present invention when the partial via is etched completely through the first integrated circuit layer. It is largely only at this time when a high etch selectivity ratio of the first integrated circuit layer with respect to the second integrated circuit layer is needed and provided.

The method of the present invention may be undertaken in-situ. The present invention provides a first etch method for forming within a first integrated circuit layer a partial via with substantially parallel sidewalls to a distance of from about 2500 to about 4000 angstroms above the surface of a second integrated circuit layer which resides beneath the first integrated circuit layer. Through a second etch method having an etch selectivity ratio for the first integrated circuit layer with respect to the second integrated circuit layer of at least about 60:1, the partial via is then etched completely through the first integrated circuit layer. Various etch methods, which typically comprise Reactive Ion Etch (RIE) etch methods, have been disclosed in the art to have selective etch properties for a first integrated circuit layer with respect to a second integrated circuit layer in contact with the first integrated circuit layer. Through appropriate choice of etch methods and etch conditions, a first etch method and a second etch method to be employed within the method of the present invention may be chosen to be undertaken in-situ.

BRIEF DESCRIPTION OF THE DRAWINGS

The objects, features and advantages of the present invention are understood within the context of the description set forth below. The description is understood in conjunction with the accompanying drawings, which form a material part of this application, wherein.

DESCRIPTION OF THE PREFERRED EMBODIMENTS

Figure 1:
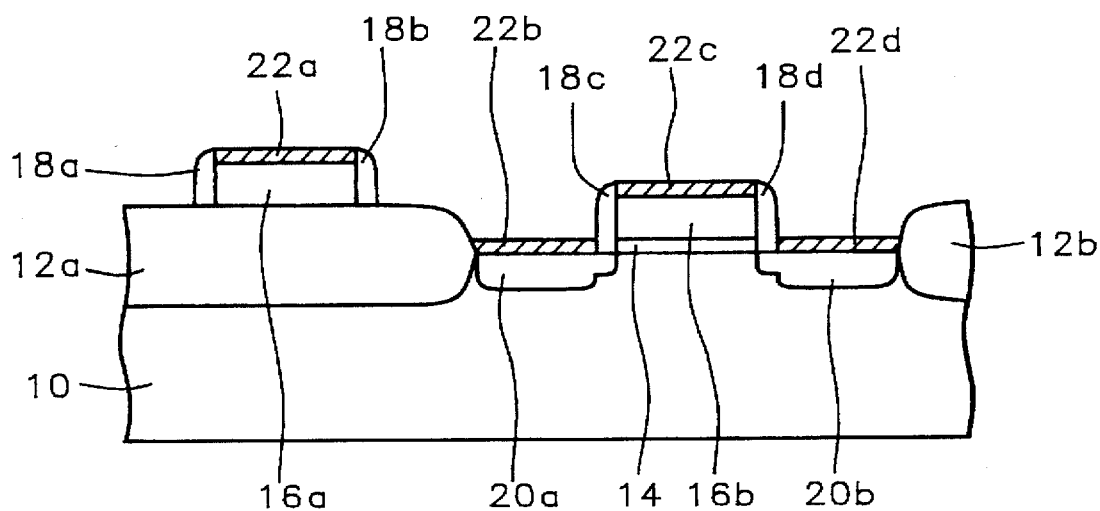
FIG. 1 to FIG. 5 show a series of schematic cross-sectional diagrams illustrating the results of progressive process steps in forming through an insulator layer within an integrated circuit a series of narrow line-width high aspect ratio vias in accord with the first preferred embodiment of the method of the present invention.

In general, the present invention provides a method for forming within an integrated circuit a narrow line-width high aspect ratio via through a first integrated circuit layer which resides upon a second integrated circuit layer. To accomplish this goal, there is first formed upon a semiconductor substrate a second integrated circuit layer upon which resides upon a first integrated circuit layer. There is then etched through a first etch method a partial via within the first integrated circuit layer to a distance of from about 2500 to about 4000 angstroms above the surface of the second integrated circuit layer. The first etch method is chosen to provide a partial via with substantially parallel sidewalls. Through a second etch method the partial via is then etched completely through the first integrated circuit layer. The second etch method is chosen to provide an etch selectivity for the first integrated circuit layer with respect to the second integrated circuit layer of at least about 60:1. The method of the present invention, in general, provides value in forming within integrated circuit layers narrow line-width high aspect ratio vias of line width less than about 8000 angstroms and aspect ratio greater than about 3.

Within the more specific preferred embodiments of the method of the present invention, the first integrated circuit layer is an insulator layer within the integrated circuit and the second integrated circuit layer is a metal silicide layer which resides beneath the insulator layer. The metal silicide layer is typically employed in forming low contact resistance connections formed through a narrow line-width high aspect ratio via between a conductor element and an integrated circuit device electrode which are separated by the insulator layer. Within the more specific preferred embodiments of the method of the present invention, value is provided in forming the narrow line-width high aspect ratio via through the insulator layer when the narrow line-width high aspect ratio via preferably has a line-width (ie: a pitch) of less than about 8000 angstroms and an aspect ratio of greater than about 3.

Through the more specific preferred embodiments of the method of the present invention, there may be formed narrow line-width high aspect ratio vias through insulator layers within various locations within integrated circuits. Through the more specific preferred embodiments of the method of the present invention, there may be formed narrow line-width high aspect ratio vias through insulator layers within integrated circuits including but not limited to the first insulator layer within an integrated circuit, such as a Pre-Metal Dielectric (PMD) layer of silicon oxide, which separates the semiconductor substrate from the first and subsequent conductor layers within the integrated circuit. In addition, through the more specific embodiments of the method of the present invention there may be provided narrow line-width high aspect ratio vias through upper-lying insulator layers which separate upper-lying conductor layers within integrated circuits.

In addition to forming narrow line-width high aspect ratio vias through insulator layers in various locations within integrated circuits, the more specific embodiments of the preferred embodiment of the method of the present invention may also be employed in forming narrow line-width high aspect ratio vias through insulator layers within various types of integrated circuits. The more specific embodiments of the preferred embodiments of the method of the present invention may be employed in forming narrow line-width high aspect ratio vias through insulator layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Metal Oxide Semiconductor Field Effect Transistors (MOSFETs), integrated circuits having within their fabrications bipolar transistors and integrated circuits having within their fabrications Bipolar Complementary Metal Oxide Semiconductor (BiCMOS) transistors.

Referring now to FIG. 1 to FIG. 5 there is shown a series of schematic cross-sectional diagrams illustrating the results of progressive process stages in forming through an insulator layer within an integrated circuit several narrow line-width high aspect ratio vias in accord with the first preferred embodiment of the method of the present invention. Shown in FIG. 1 is a schematic cross-sectional diagram of the integrated circuit at its early stages of fabrication.

Shown in FIG. 1 is a semiconductor substrate 10 within and upon whose surface is formed isolation regions 12a and 12b which define the active region of the semiconductor substrate 10. Although the semiconductor substrate 10 upon which is practiced the first preferred embodiment of the method of the present invention may be formed with either dopant polarity, any dopant concentration and any crystallographic orientation, the semiconductor substrate 10 upon which is practiced the first preferred embodiment of the method of the present invention is preferably a (100) silicon semiconductor substrate having an N− or a P− doping.

Similarly, there are several methods through which isolation regions may be formed within and/or upon semiconductor substrates. Although several alternative methods may be employed in forming the isolation regions 12a and 12b within and upon the semiconductor substrate 10, the isolation regions 12a and 12b are preferably formed through a thermal oxidation method whereby portions of the semiconductor substrate 10 exposed through an appropriate oxidation mask are oxidized to form isolation regions 12a and 12b of silicon oxide within and upon the semiconductor substrate 10.

Also shown in FIG. 1 is the presence of several components which comprise a Metal Oxide Semiconductor Field Effect Transistor (MOSFET), along with several additional components which are formed simultaneously with some of the components which comprise the Metal Oxide Semiconductor Field Effect Transistor (MOSFET). The components which comprise the Metal Oxide Semiconductor Field Effect Transistor (MOSFET) include a gate oxide layer 14 upon which resides a gate electrode 16b, a pair of insulator spacers 18c and 18d adjoining a pair of opposite edges of the gate oxide layer 14 and the gate electrode 16b, and a pair of source/drain electrodes 20a and 20b formed into the surface of the semiconductor substrate 10 adjoining the pair of opposite edges of the gate oxide layer 14 and the gate electrode 16b. The additional components which are formed simultaneously with some of the components which form the Metal Oxide Semiconductor Field Effect Transistor (MOSFET) are the gate electrode 16a which is formed simultaneously with the gate electrode 16b, and the insulator spacers 18a and 18b which are formed simultaneously, with the spacers 18c and 18d. Each of the foregoing components and additional components may be formed through methods and materials which are conventional in the art of forming Metal Oxide Semiconductor Field Effect Transistors (MOSFETs) within integrated circuits.

Typically, although not exclusively, the gate oxide layer 14 is formed through patterning through methods as are conventional in the art of a blanket gate oxide layer formed upon the active region of the semiconductor substrate 10 through thermal oxidation of the active region of the semiconductor substrate 10 at a temperature of from about 750 to about 850 degrees centigrade to yield a typical blanket gate oxide layer of thickness from about 70 to about 90 angstroms.

Analogously with the gate oxide layer 14, the gate electrodes 16a and 16b are also typically patterned through methods as are conventional in the art, although the patterning is undertaken upon a blanket layer of gate electrode material formed upon the blanket gate oxide layer. The blanket layer of gate electrode material may be formed of several conductive materials, including but not limited to metals, metal alloys, highly doped polysilicon and polycides (highly doped polysilicon/metal silicide stacks) formed upon the surface of the blanket gate oxide layer through a deposition method appropriate to the conductive material from which is formed the blanket layer of gate electrode material. For the first preferred embodiment of the method of the present invention, the gate electrodes 16a and 16b are preferably formed through patterning through methods as are conventional in the art of a blanket layer of highly doped polysilicon formed upon the blanket gate oxide layer at a thickness of from about 2000 to about 3000 angstroms. After the gate electrodes 16a and 16b have been patterned from the blanket layer of highly doped polysilicon, the gate electrode 16b may be employed as a mask in patterning the gate oxide layer 14 from the blanket gate oxide layer.

Although the insulator spacers 18a, 18b, 18c and 18d may be formed of several insulator materials, including but not limited to silicon oxide insulator materials, silicon nitride insulator materials and silicon oxynitride insulator materials, the insulator spacers 18a, 18b, 18c and 18d are typically and preferably formed of a silicon oxide insulator material. The insulator spacers 18a, 18b, 18c and 18d are preferably formed through an anisotropic Reactive Ion Etch (RIE) etch method whereby a blanket layer of silicon oxide insulator material is anisotropically etched to form the insulator spacers 18a, 18b, 18c and 18d.

As is known in the art, the source/drain electrodes 20a and 20b of the Metal Oxide Semiconductor Field Effect Transistor (MOSFET) are typically formed from a low dose ion implant prior to forming the insulator spacers 18c and 18d followed by a high dose ion implant after forming the insulator spacers 18c and 18d. The polarity desired for the Metal Oxide Semiconductor Field Effect Transistor (MOSFET) will dictate the polarity of the low dose ion implant and the high dose ion implant in forming the source/drain electrodes 20a and 20b. Arsenic dopant species, boron dopant species and phosphorus dopant species are common in the art of forming source/drain electrodes. For the first preferred embodiment of the method of the present invention, the source/drain electrodes 20a and 20b are preferably formed through implanting ions of suitable polarity into the active region of the semiconductor substrate 10 through a low dose ion implant at an ion implant dose of from about 5E12 to about 6E13 ions per square centimeter and an ion implantation energy of from about 30 to about 40 keV followed by a high dose ion implant at an ion implant dose of from about 2E15 to about 5E15 ions per square centimeter and an ion implantation energy of from about 30 to about 50 keV.

Finally, there is shown in FIG. 1 the presence of patterned metal silicide layers 22a, 22b, 22c and 22d formed, respectively, upon the surfaces of the gate electrode 16a, the source/drain electrode 20a, the gate electrode 16b and the source/drain electrode 20b. Methods and materials through which patterned metal silicide layers may be formed upon the surfaces of integrated circuits are known in the art. Although patterned metal silicide layers may alternatively be formed through patterning through methods as are known in the art of blanket metal silicide layers independently deposited within integrated circuits, typically, patterned metal silicide layers are often preferably formed in a serf-aligned fashion by forming a blanket metal silicide forming metal layer upon the surface of an integrated circuit and annealing the blanket metal silicide forming metal layer to form a patterned metal silicide layer from reaction with silicon surfaces within the integrated circuit with which the blanket metal silicide forming metal layer makes contact. Excess unreacted portions of the blanket metal silicide forming metal layer may then be removed through selective etch methods as are conventional in the art. Several metal silicide forming metals which may be employed in forming the patterned metal silicide layers 22a, 22b, 22c and 22d are known in the art, including but not limited to titanium, tungsten, platinum, cobalt and tantalum. For the first preferred embodiment of the method of the present invention, the patterned metal silicide layers 22a, 22b, 22c and 22d are preferably formed of a metal silicide formed through a self-aligned fashion, as is common in the art. Preferably, the metal silicide is chosen from the group of metal silicides consisting of titanium silicide, tungsten silicide, platinum silicide, cobalt silicide and tantalum silicide. Most preferably, the metal silicide is titanium silicide. Preferably, the thickness of the patterned metal silicide layers is from about 400 to about 700 angstroms each.

Figure 2:
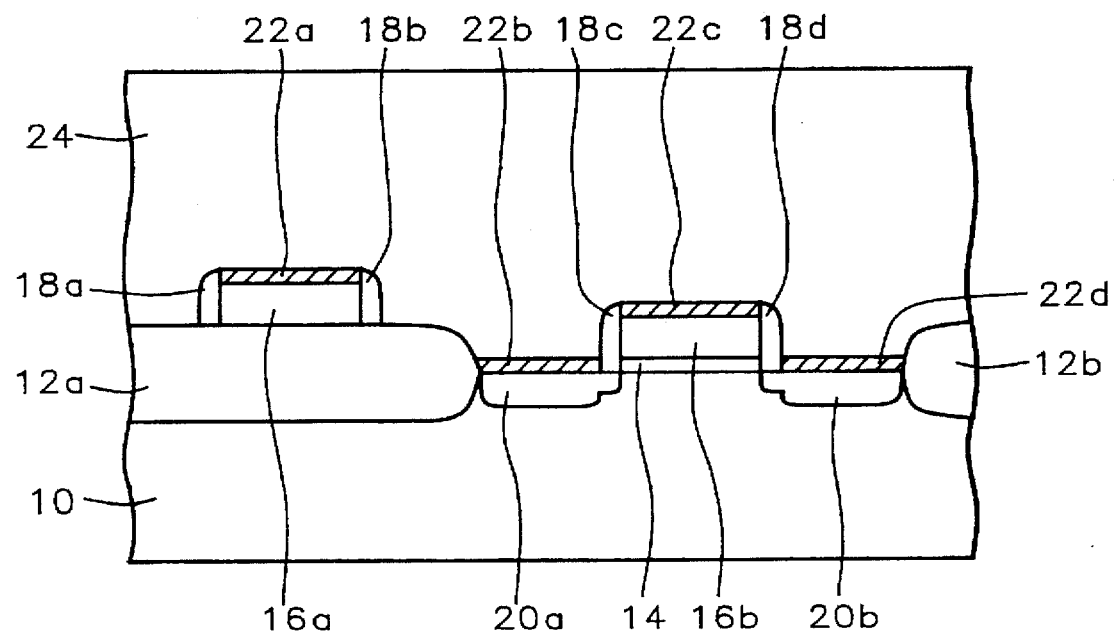

Referring now to FIG. 2 there is shown a schematic cross-sectional diagram illustrating the results of further processing of the integrated circuit whose schematic cross-sectional diagram is illustrated in FIG. 1. Shown in FIG. 2 is the presence of a blanket planarized Pre-Metal Dielectric (PMD) 24 layer formed upon the surface of the integrated circuit whose schematic cross-sectional diagram is illustrated in FIG. 1.

Methods and materials through which blanket planarized Pre-Metal Dielectric (PMD) layers may be formed within integrated circuits are known in the art. Blanket planarized Pre-Metal Dielectric layers are typically, although not exclusively, formed within integrated circuits through planarizing, through methods as are conventional in the art, of blanket conformal Pre-Metal Dielectric (PMD) layers. Blanket conformal Pre-Metal Dielectric (PMD) layers may be formed of dielectric materials including but not limited to silicon oxide dielectric materials, silicon nitride dielectric materials and silicon oxynitride dielectric materials, formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods. The blanket conformal Pre-Metal Dielectric (PMD) layer, once formed, may then be planarized through methods as are conventional in the art, including but not limited to Reactive Ion Etch (RIE) etch-back planarizing methods and Chemical Mechanical Polish (CMP) planarizing methods.

For the first preferred embodiment of the method of the present invention, the blanket planarized Pre-Metal Dielectric (PMD) layer 24 is preferably formed of a silicon oxide dielectric material formed through a Plasma Enhanced Chemical Vapor Deposition (PECVD) method and planarized through a Chemical Mechanical Polish (CMP) planarizing method, as is conventional in the art. Preferably, the blanket planarized Pre-Metal Dielectric (PMD) layer 24 is from about 7000 to about 12000 angstroms thick.

Figure 3:
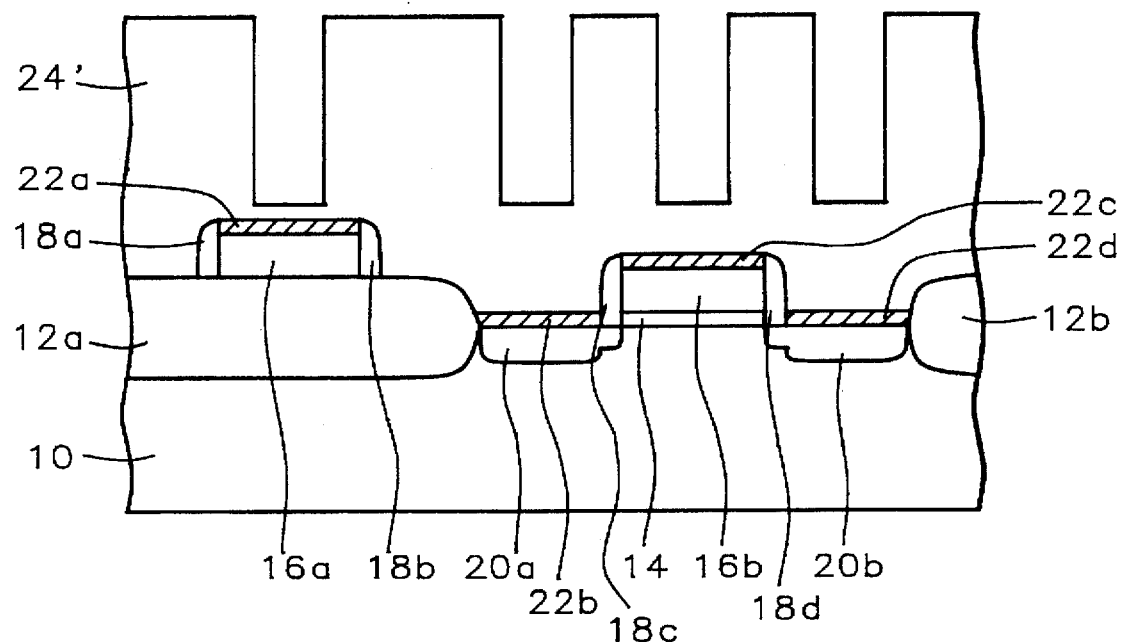

Referring now to FIG. 3, there is shown a schematic cross-sectional diagram illustrating the results of further processing of the integrated circuit whose schematic cross-sectional diagram is illustrated in FIG. 2. Shown in FIG. 3 is the presence of partial vias formed through the blanket planarized Pre-Metal Dielectric (PMD) layer 24 illustrated in FIG. 2 to form the partially patterned planarized Pre-Metal Dielectric (PMD) layer 24'. In partially patterning the blanket planarized Pre-Metal Dielectric (PMD) layer 24 to form the partial vias within the partially patterned planarized Pre-Metal Dielectric (PMD) layer 24', there is employed a first etch method through which may be formed partial vias with substantially parallel sidewalls. Preferably, the partial vias formed within the partially patterned planarized Pre-Metal Dielectric (PMD) layer 24' are preferably formed to a distance of from about 2500 to about 4000 angstroms from the patterned metal silicide layers 22a, 22b, 22c and 22d. However, under circumstances of substantial topographic variation it may not be possible to form all of the partial vias within the partially patterned planarized Pre-Metal Dielectric (PMD) layer 24' to within about 2500 to about 4000 angstroms of each of the patterned metal silicide layers 22a, 22b, 22c and 22d. Under such circumstances it is preferred to form at least one of the partial vias within the partially patterned planarized Pre-Metal Dielectric (PMD) layer 24' to within about 500 to about 1000 angstroms of the uppermost lying of the patterned metal silicide layers 22a, 22b, 22c and/or 22d.

Although several alternative methods may in general exist for providing the first etch method, the first etch method of the first preferred embodiment of the method of the present invention is preferably a Reactive Ion Etch (RIE) first etch method. It has been found experimentally that the Reactive Ion Etch (RIE) first etch method through which may be formed partial vias of substantially parallel sidewalls within the preferred blanket planarized Pre-Metal Dielectric (PMD) layer 24 of silicon oxide is formed of a reactant gas mixture comprising tri-fluoro methane (CHF3), carbon tetra-fluoride (CF4) and argon (Ar). The preferred Reactive Ion Etch (RIE) first etch method is preferably employed at a Reactive Ion Etch (RIE) reactor pressure of from about 250 to about 500 mtorr and a Reactive Ion Etch (RIE) radio frequency power of from about 1200 to about 1500 watts. Other parameters within which the Reactive Ion Etch (RIE) first etch method is preferably employed include a CHF3:CF4:Ar ratio of from about 1:1.2:8 to about 1:1.5:10, a total reactant gas flow rate of from about 550 to about 800 standard cubic centimeters per minute (sccm) and a substrate temperature of from about −10 to about 20 degrees centigrade.

Figure 4:
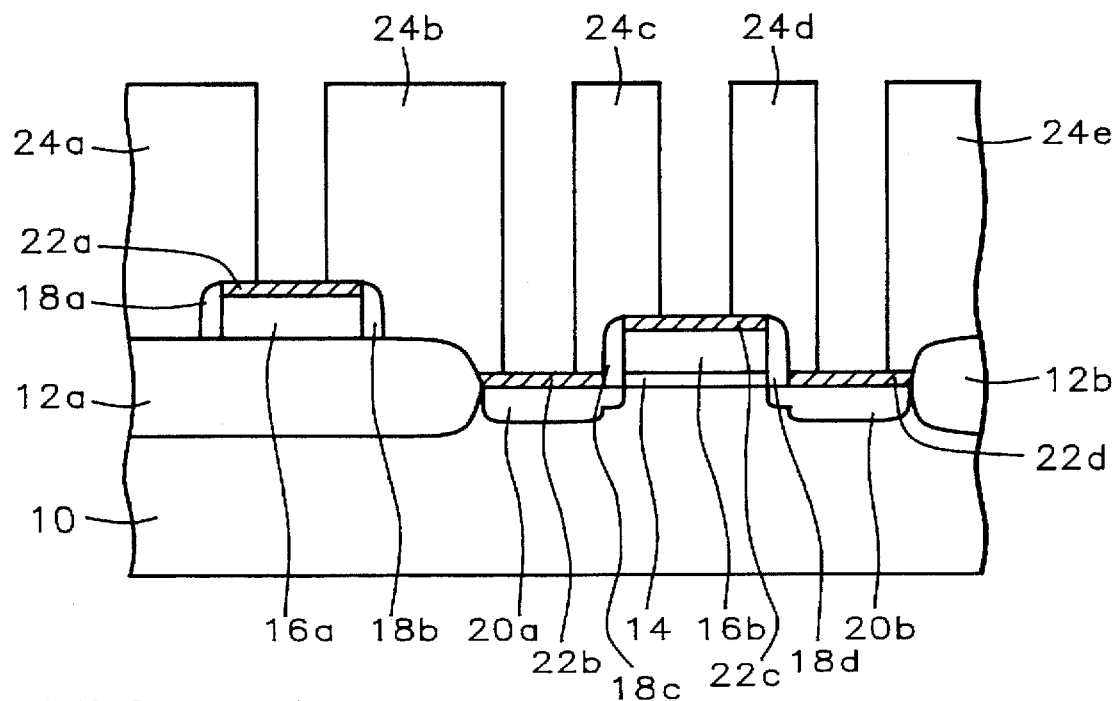

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of the complete etching through the partially patterned planarized Pre-Metal Dielectric (PMD) layer 24' of the partial vias to form corresponding complete vias which reach the surfaces of the patterned metal silicide layers 22a, 22b, 22c and 22d while simultaneously forming the patterned planarized Pre-Metal Dielectric (PMD) layers 24a, 24b, 24c, 24d and 24e. In order to form the partial vias completely through the partially patterned planarized Pre-Metal Dielectric (PMD) layer 24', there is employed a second etch method which is chosen to provide an etch selectivity ratio for the partially patterned planarized Pre-Metal Dielectric (PMD) layer 24' with respect to the metal silicide layers 22a, 22b, 22c and 22d of at least about 60:1.

Although there may be alternative methods through which the partial vias within the partially patterned planarized Pre-Metal Dielectric (PMD) layer 24' may be completely etched through the partially patterned planarized Pre-Metal Dielectric (PMD) layer 24' to form the patterned planarized Pre-Metal Dielectric layers 24a, 24b, 24c, 24d and 24e with an etch selectivity for the partially patterned planarized Pre-Metal Dielectric (PMD) layer 24' with respect to the patterned metal silicide layers 22a, 22b, 22c and 22d of greater than about 60:1, for the first preferred embodiment of the method of the present invention, the second etch method is preferably also a Reactive Ion Etch (RIE) etch method so that the first etch method and the second etch method may readily be undertaken in-situ. For the first preferred embodiment of the method of the present invention, the Reactive Ion Etch (RIE) second etch method is preferably a Reactive Ion Etch (RIE) method analogous to the Reactive Ion Etch (RIE) etch method disclosed in Taiwan Patent 249295, as discussed in the foregoing Description of the Related Art. Preferably, the Reactive Ion Etch (RIE) second etch method employs a Reactive Ion Etch (RIE) reactant gas composition comprising trifluoro methane (CHF3), nitrogen (N2) and helium (He) at a Reactive Ion Etch (RIE) reactor chamber pressure of from about 1500 to about 2000 mtorr and a Reactive Ion Etch (RIE) radio frequency power of from about 1200 to about 1500 watts. Other parameters under which the Reactive Ion Etch (RIE) second etch method is preferably employed include a CHF3:N2:He ratio of from about 1.75:1:90 to about 3:1:115, a total Reactive Ion Etch (RIE) reactant gas flow rate of from about 3700 to about 4700 standard cubic centimeters per minute and a substrate temperature of from about −10 to about 20 degrees centigrade.

Figure 5:
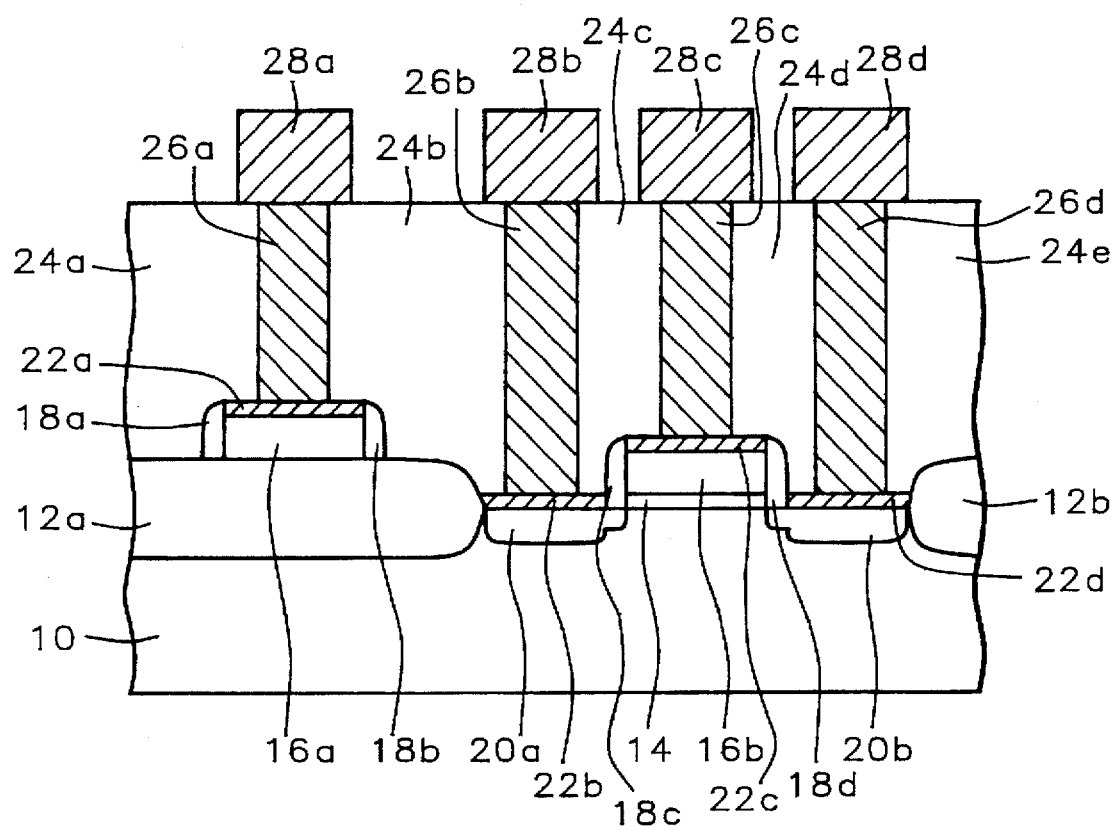

Referring now to FIG. 5, there is shown a schematic cross-sectional diagram illustrating the results of further processing of the integrated circuit whose schematic cross-sectional diagram is illustrated in FIG. 4. Shown in FIG. 5 is the presence of conductive interconnection studs 26a, 26b, 26c and 26d formed into the corresponding vias adjoining the patterned planarized Pre-Metal Dielectric (PMD) layers 24a, 24b, 24c, 24d and 24e and making contact, respectively, with the metal silicide layers 22a, 22b, 22c and 22d. Methods and materials through which conductive interconnection studs may be formed within integrated circuits are known in the art of integrated circuit manufacture. Conductive interconnection studs may be formed of conductive materials including but not limited to metals, metal alloys and highly doped polysilicon deposited through methods including but not limited to thermally assisted evaporation methods, electron beam assisted evaporation methods, Chemical Vapor Deposition (CVD) methods and Physical Vapor Deposition (PVD) sputtering methods, as appropriate to the conductive material from which is formed the conductive interconnection studs. For the first preferred embodiment of the method of the present invention, the conductive interconnection studs 26a, 26b, 26c and 26d are preferably formed at least in part of tungsten metal deposited through a Chemical Vapor Deposition (CVD) method, as is common in the art.

Finally, there is shown within FIG. 5 the presence of patterned first conductor layers 28a, 28b, 28c and 28d formed upon the patterned planarized Pre-Metal Dielectric (PMD) layers 24a, 24b, 24c, 24d and 24e and contacting the corresponding conductive interconnection studs 26a, 26b, 26c and 26d. Methods and materials through which patterned first conductor layers may be formed within integrated circuit are known in the art of integrated circuit manufacture. Patterned first conductor layers are typically, although not exclusively, formed through patterning, through methods as are conventional in the art, of blanket first conductor layers. Blanket first conductor layers may be formed from conductor materials including but not limited to metals and metal alloys which are formed within integrated circuits through methods including but not limited to thermally assisted evaporation methods, electron beam assisted evaporation methods and Physical Vapor Deposition (PVD) sputtering methods. For the first preferred embodiment of the method of the present invention, the patterned first conductor layers 28a, 28b, 28c and 28d are preferably formed through patterning, through methods as are conventional in the art, of a blanket first conductor layer formed at least in part of aluminum or an aluminum alloy, as is common in the art.

Figure 6:
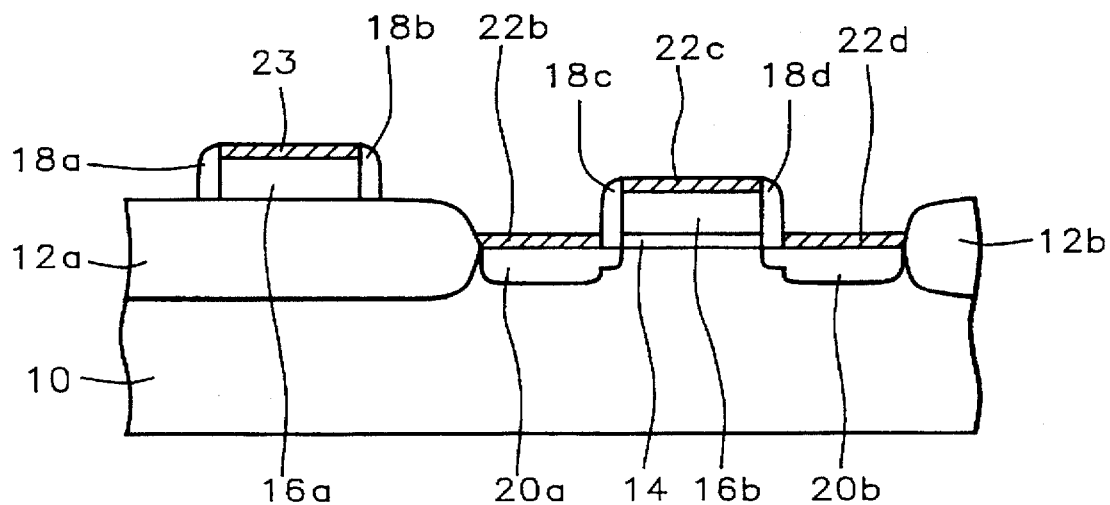
FIG. 6 to FIG. 9 show a series of schematic cross-sectional diagrams illustrating the remits of progressive process stages in forming through an insulator layer within an integrated circuit a series of narrow line-width high aspect ratio vias in accord with the second preferred embodiment of the method of the present invention.

In addition to the first preferred embodiment of the method of the present invention, there also exists a second preferred embodiment of the method of the present invention. Shown in FIG. 6 to FIG. 9 is a series of schematic cross-sectional diagrams illustrating the results of progressive process stages in forming within an integrated circuit a series of narrow line-width high aspect ratio vias through an insulator layer in accord with the second preferred embodiment of the method of the present invention. The methods, materials, structures and dimensions which are employed in forming the narrow line-width high aspect ratio vias through an insulator layer through the second preferred embodiment of the method of the present invention are otherwise equivalent to the methods, materials, structures and dimensions employed in forming the narrow line-width high aspect ratio vias through an insulator layer in accord with the first preferred embodiment of the method of the present invention, with exceptions as noted in the following description. Shown in FIG. 6 is a schematic cross-sectional diagram of the integrated circuit at its early stages of fabrication.

Shown in FIG. 6 is an integrated circuit whose schematic cross-sectional diagram is otherwise equivalent to the schematic cross-sectional diagram illustrated in FIG. 1, with the exception that the patterned metal silicide layer 22a within FIG. 1 has been replaced with a high etch selectivity patterned metal silicide layer 23 in FIG. 6. By employing the high etch selectivity patterned metal silicide layer 23, rather than the patterned metal silicide layer 22a, it is possible in general within the second preferred embodiment of the method of the present invention to form a series of partial vias closer in depth within a blanket planarized Pre-Metal Dielectric (PMD) layer subsequently formed upon the integrated circuit whose cross-sectional diagram is illustrated in FIG. 6 towards the metal silicide layers 22b, 22c and 22d under circumstances where there otherwise would exist a substantial step height between the surface of the metal silicide layer 22a and the metal silicide layers 22b, 22c and/or 22d.

More specifically, the use of the high etch selectivity metal silicide layer 23 provides most value within the second preferred embodiment of the method of the present invention when a substantial step height exists between the gate electrode 16a and the gate electrode 16b. Such a substantial step height will exist when an exceedingly thick isolation region 12a is formed upon the surface of the semiconductor substrate 10. The magnitude of the etch selectivity of the high etch selectivity patterned metal silicide layer 23 is dictated within the context of the comparative etch selectivity within both the first etch method and the second etch method of the blanket planarized Pre-Metal Dielectric (PMD) layer 24 (not shown within FIG. 6) which is subsequently formed upon the integrated circuit whose schematic cross-sectional diagram is illustrated in FIG. 6. Analogously with the first preferred embodiment of the method of the present invention, the etch selectivity ratio of the blanket planarized Pre-Metal Dielectric (PMD) layer 24 with respect to the patterned metal silicide layers 22a, 22b, 22c and 22d is preferably at least about 60:1 within the second etch method. In addition, within the second preferred embodiment of the method of the present invention, the etch selectivity ratio of the planarized Pre-Metal Dielectric (PMD) layer 24 with respect to the high etch selectivity patterned metal silicide layer 23 is preferably substantially higher. It has been found experimentally that the foregoing etch selectivity ratio conditions are met when the high etch selectivity metal silicide layer 23 is formed of tungsten silicide and the patterned metal silicide layers 22b, 22c and 22d are formed of titanium silicide. Thus, for the second preferred embodiment of the method of the present invention, the high etch selectivity metal silicide layer 23 is preferably formed of tungsten silicide, and the patterned metal silicide layers 22b, 22c and 22d are preferably formed of titanium silicide. Other combinations of high etch selectivity metal silicide layer 23 and patterned metal silicide layers 22b, 22c and 22d may, however, be employed provided that the preferred etch selectivity ratio conditions are met.

Figure 7:
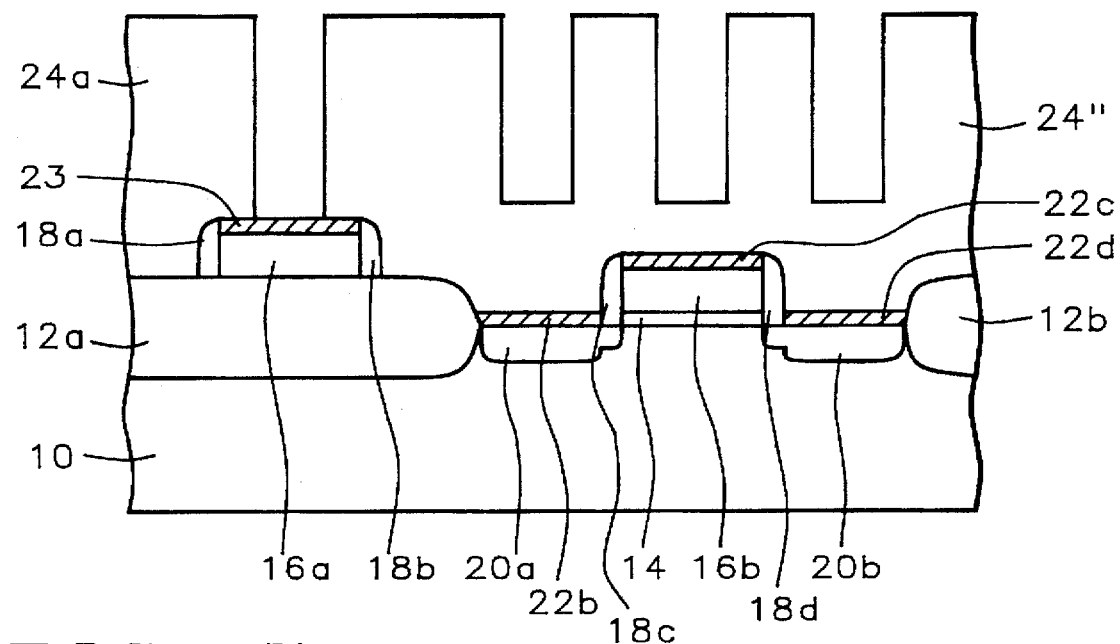

Referring now to FIG. 7 there is shown a schematic cross-sectional diagram illustrating the results of further processing of the integrated circuit whose schematic cross-sectional diagram is illustrated in FIG. 6. Shown in FIG. 7 is the results of etching, through a first etch method equivalent to the first etch method employed within the first preferred embodiment of the method of the present invention, a blanket Pre-Metal Dielectric (PMD) layer (not shown in FIG. 7) otherwise equivalent to the blanket Pre-Metal Dielectric (PMD) layer 24 to form the patterned planarized Pre-Metal Dielectric (PMD) layer 24a and the partially patterned planarized Pre-Metal Dielectric layer 24" while simultaneously exposing the surface of the high etch selectivity patterned metal silicide layer 23. The first etch method is preferably undertaken until the partial via within the partially patterned planarized Pre-Metal Dielectric (PMD) layer 24" closest to the patterned metal silicide layer 22c is from about 500 to about 1000 angstroms from the surface of the patterned metal silicide layer 22c. Due to the increased etch selectivity ratio within the first etch method between the high etch selectivity patterned metal silicide layer 23 and the blanket planarized Pre-Metal Dielectric (PMD) layer 24, the partial vias formed above the patterned metal silicide layers 22b, 22c and 22d may be formed within about 500 to about 1000 angstroms of the uppermost patterned metal silicide layer 22c while not substantially affecting the high etch selectivity metal silicide layer 23.

Figure 8:
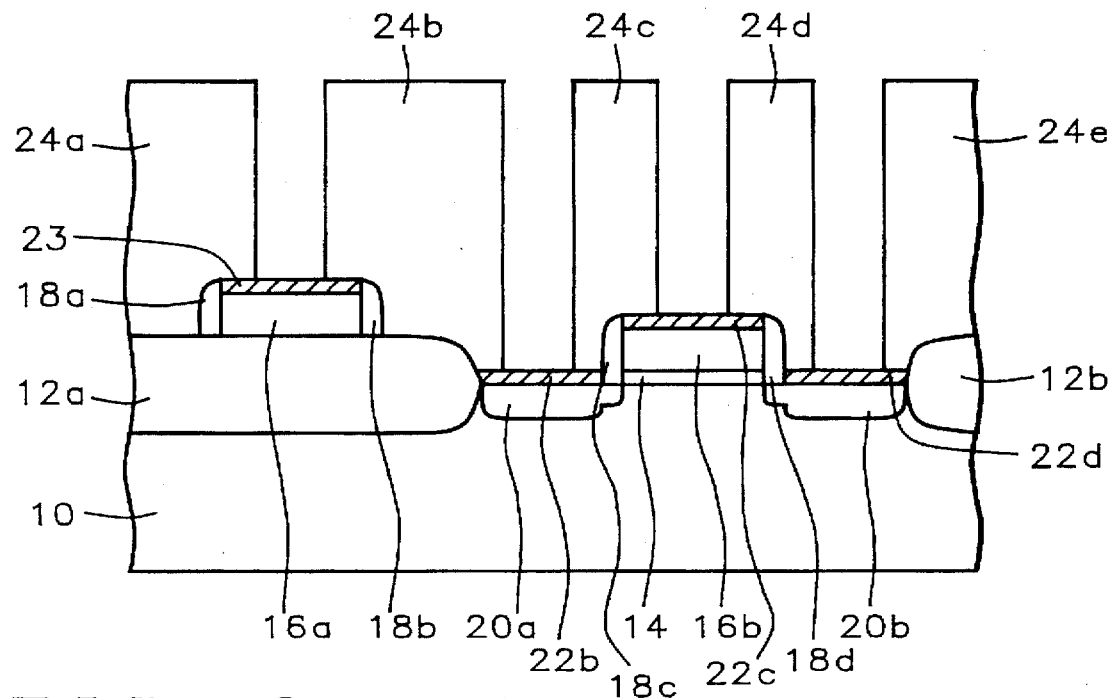

Referring now to FIG. 8, there is shown a schematic cross-sectional diagram illustrating the results of further processing of the integrated circuit whose schematic cross-sectional diagram is illustrated in FIG. 7. Illustrated in FIG. 8 is the results of etching through the second etch method the partial vias through the partially patterned planarized Pre-Metal Dielectric (PMD) layer 24" to expose the surfaces of the metal silicide layers 22b, 22c and 22d while simultaneously forming the patterned planarized Pre-Metal Dielectric (PMD) layers 24b, 24c, 24d and 24e. Due to the increased etch selectivity ratio within the second etch method for the partially patterned planarized Pre-Metal Dielectric layer 24" with respect to the high etch selectivity patterned metal silicide layer 23, the partial vias may be etched completely through the partially patterned planarized Pre-Metal Dielectric (PMD) layer 24" while not substantially affecting the high etch selectivity patterned metal silicide layer 23.

Figure 9:
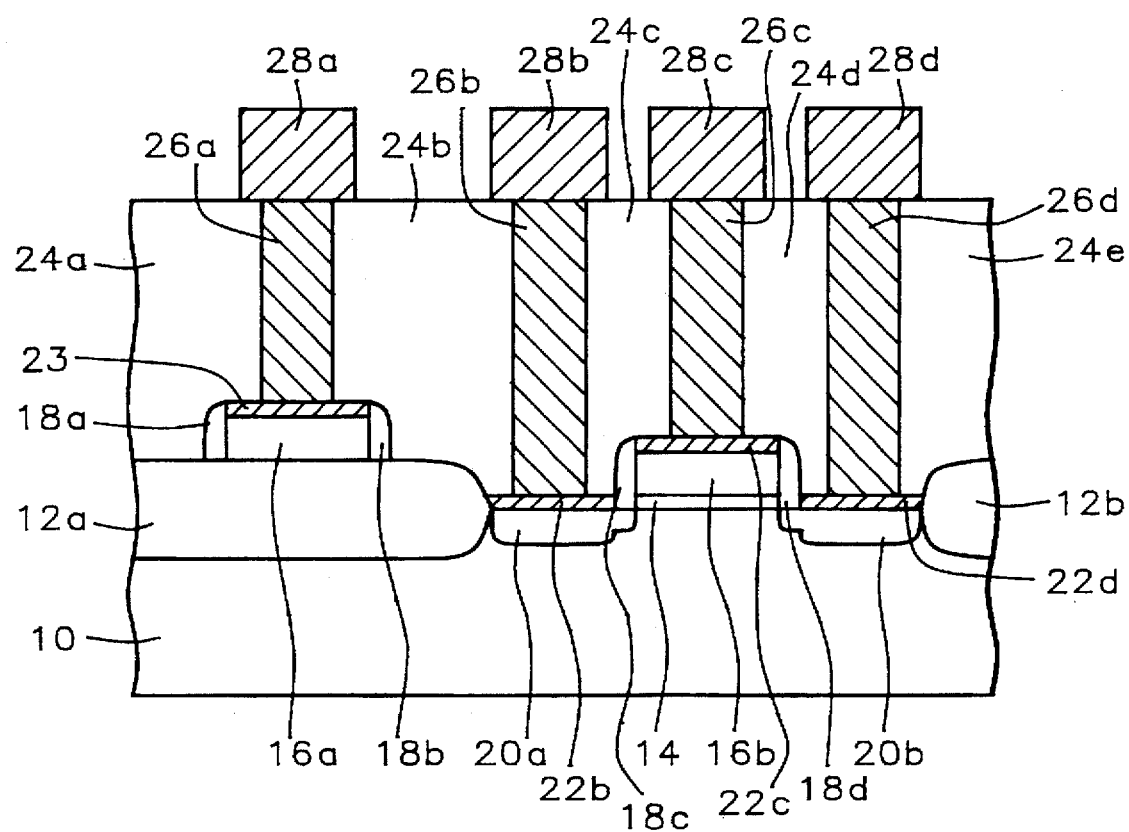

Referring now to FIG. 9, there is shown a schematic cross-sectional diagram illustrating the results of farther processing of the integrated circuit whose schematic cross-sectional diagram is illustrated in FIG. 8. Shown in FIG. 9 is the presence of: (1) the conductive interconnection studs 26a, 26b, 26c and 26d; and (2) the corresponding patterned first conductor layers 28a, 28b, 28c and 28d. As indicated above, the conductive interconnection studs 26a, 26b, 26c and 26d, and the corresponding patterned first conductor layers 28a, 28b, 28c and 28d, are formed through methods, materials, structures and dimensions equivalent to the methods, materials, structures and dimensions employed within the first preferred embodiment of the method of the present invention.

Upon forming the patterned first conductor layers 28a, 28b, 28c and 28d within the integrated circuit formed through either the first preferred embodiment of the method of the present invention or the second preferred embodiment of the method of the present invention, there is formed an integrated circuit having formed therein a series of narrow line-width high aspect ratio vias through a first layer formed of a Pre-Metal Dielectric (PMD) residing upon a second layer formed of a patterned metal silicide layer, the narrow line-width high aspect ratio vias being formed with substantially parallel sidewalls completely through the first layer without damaging the second layer.

EXAMPLES

Upon the surfaces of three (100) silicon semiconductor substrates were formed separate titanium silicide layers of about 500 angstroms thickness each. The titanium silicide layers were formed through thermal annealing at a temperature of about 800 degrees centigrade of three separate titanium layers formed upon the silicon semiconductor substrates at a thickness of about 500 angstroms each. Formed then upon the three titanium silicide layers were three separate composite silicon oxide insulator layers formed of lower-lying Boro Phospho Silicate Glass (BPSG) layers of about 6000 angstroms each upon which were formed Plasma Enhanced Chemical Vapor Deposited (PECVD) silicon oxide layers of about 6000 angstroms each.

A series of narrow line-width high aspect ratio vias was then etched through the composite silicon oxide insulator layer upon one of the semiconductor substrates through a method in accord with the Reactive Ion Etch (RIE) first etch method described above within the Description of the Preferred Embodiments. The line-width of the narrow line-width high aspect ratio vias was about 4000 angstroms. The Reactive Ion Etch (RIE) method employed a Reactive Ion Etch (RIE) reactant gas mixture of tri-fluoro methane (CHF3), carbon tetra-fluoride (CF4) and argon (Ar) at CHF3:CF4:Ar flows of about 50:60:400 standard cubic centimeters per minute (sccm). The Reactive Ion Etch (RIE) method also employed a Reactive Ion Etch (RIE) reactor chamber pressure of about 300 mtorr, a Reactive Ion Etch (RIE) radio frequency power of about 1300 watts and a substrate temperature of about 0 degrees centigrade. The Reactive Ion Etch (RIE) method was employed for a time period of about 30 seconds.

A series of narrow line-width high aspect ratio vias was then formed through the composite silicon oxide insulator layer upon a second one of the three semiconductor substrates through a method in accord with the Reactive Ion Etch (RIE) second etch method described above within the Description of the Preferred Embodiments. The line-width of the narrow line-width high aspect ratio vias was also about 4000 angstroms. The Reactive Ion Etch (RIE) method employed a Reactive Ion Etch (RIE) reactant gas mixture of tri-fluoro methane (CHF3), nitrogen (N2) and helium (He) at CHF3:N2:He flows of about 70:40:3600 standard cubic centimeters per minute (sccm). The Reactive Ion Etch (RIE) method also employed a Reactive Ion Etch (RIE) reactor chamber pressure of about 1600 mtorr, a Reactive Ion Etch (RIE) radio frequency power of about 1300 watts and a substrate temperature of about 0 degrees centigrade. The Reactive Ion Etch (RIE) method was employed for a time period of about 100 seconds, which included about 50 percent over-etch of the titanium silicide layer.

Finally, upon the third of the three semiconductor substrates was formed a series of narrow line-width high aspect ratio vias through a composite Reactive Ion Etch (RIE) method of the Reactive Ion Etch (RIE) first etch method employed with the first semiconductor substrate and the Reactive Ion Etch (RIE) second etch method employed with the second semiconductor substrate. The Reactive Ion Etch (RIE) first etch method was employed until the series of vias was formed to a depth within the composite silicon oxide insulator layer about 6000 angstroms above the titanium silicide layer. The Reactive Ion Etch (RIE) second etch method was then employed to complete the etching of the series of vias, with about 50 percent over-etch.

With the aid of Scanning Electron Microscopy (SEM) analysis, there was then measured: (1) the taper of the sidewalls within the three series of narrow line-width high aspect ratio vias, and (2) the extent of etching loss of the titanium silicide layers. The results of the measurements are reported in TABLE I.

TABLE 1

| Example | Conditions | Sidewall Taper | TiSi Loss |
|---|---|---|---|
| 1 | first etch only | 87–90 degrees | 200–300 angstroms |
| 2 | second etch only | 60–65 | 0 |
| 3 | first etch + second etch | 80–85 | 0 |

From review of the data of TABLE I, it is seen that the composite Reactive Ion Etch (RIE) first etch method and Reactive Ion Etch (RIE) second etch method employed in forming the series of narrow line-width high aspect ratio vias through the composite silicon oxide insulator layer upon the third semiconductor substrate provides the substantially parallel via sidewalls and low titanium silicide loss desired for narrow line-width high aspect ratio vias formed through insulator layers within advanced integrated circuits.

As is understood by a person skilled in the art, the preferred embodiments of the method of the present invention and the examples of the method of the present invention are illustrative of the method of the present invention rather than limiting of the method of the present invention. Revisions may be made to methods, materials, structures and dimensions through which are practiced the preferred embodiments and examples of the method of the present invention while still forming embodiments and examples which are within the spirit and scope of the method of the present invention.

What is claimed is:

1. A method for forming within an integrated circuit a via through a silicon containing insulator layer to access a metal silicide layer comprising:
   providing a semiconductor substrate;
   forming over the semiconductor substrate a metal silicide layer;
   forming upon the metal silicide layer a silicon containing insulator layer;
   etching through a first Reactive Ion Etch (RIE) method a partial via within the silicon containing insulator layer without exposing the metal silicide layer, the first Reactive Ion Etch (RIE) method employing a tri-fluoro methane (CHF3)/carbon tetra-fluoride (CF4)/argon (Ar) reactant gas mixture; and
   etching through a second Reactive Ion Etch (RIE) method the partial via to form a via completely through the silicon containing insulator layer, the via exposing the metal silicide layer, the second Reactive Ion Etch (RIE) method employing a tri-fluoro methane (CHF3)/nitrogen (N2)/helium (He) reactant gas mixture.

2. The method of claim 1 wherein the silicon containing insulator layer is chosen from the group of silicon containing insulator layers consisting of silicon oxide insulator layers, silicon nitride insulator layers and silicon oxynitride insulator layers.

3. The method of claim 2 wherein the silicon containing insulator layer is from about 7000 to about 12000 angstroms thick.

4. The method of claim 1 wherein the metal silicide layer is chosen from the group of metal silicide layers consisting of titanium silicide, tungsten silicide, platinum silicide, cobalt silicide and tantalum silicide layers.

5. The method of claim 4 wherein the metal silicide layer is from about 400 about 700 angstroms thick.

6. The method of claim 1 wherein the first Reactive Ion Etch (RIE) method employs a reactor chamber pressure of from about 250 to about 500 mtorr and a radio frequency power of from about 1200 to about 1500 watts.

7. The method of claim 1 wherein the second Reactive Ion Etch (RIE) method employs a reactor chamber pressure of from about 1500 to about 2000 mtorr and a radio frequency power of from about 1200 to about 1500 watts.

8. A method for forming within an integrated circuit a via through a silicon containing insulator layer to access a metal silicide layer formed upon an integrated circuit device electrode comprising:
   providing a semiconductor substrate;
   forming within and upon the semiconductor substrate an integrated circuit device, the integrated circuit device having an integrated circuit device electrode formed therein;
   forming upon the integrated circuit device electrode a metal silicide layer;
   forming upon the integrated circuit device and the metal silicide layer a silicon containing insulator layer;
   etching through a first Reactive Ion Etch (RIE) method a partial via within the silicon containing insulator layer without exposing the metal silicide layer, the first Reactive Ion Etch (RIE) method employing a tri-fluoro methane (CHF3)/carbon tetra-fluoride (CF4)/argon (Ar) reactant gas mixture;
   etching through a second Reactive Ion Etch (RIE) method the partial via to form a via completely through the silicon containing insulator layer, the via exposing the metal silicide layer, the second Reactive Ion Etch (RIE) method employing a tri-fluoro methane (CHF3)/nitrogen (N2)/helium (He) reactant gas mixture.

9. The method of claim 8 wherein the integrated circuit device is a Metal Oxide Semiconductor Field Effect Transistor (MOSFET) and the integrated circuit device electrode is a Metal Oxide Semiconductor Field Effect Transistor (MOSFET) electrode.

10. The method of claim 8 wherein the silicon containing insulator layer is chosen from the group of silicon containing insulator layers consisting of silicon oxide insulator layers, silicon nitride insulator layers and silicon oxynitride insulator layers.

11. The method of claim 10 wherein the silicon containing insulator layer is from about 7000 to about 12000 angstroms thick.

12. The method of claim 8 wherein the metal silicide layer is chosen from the group of metal silicide layers consisting of titanium silicide, tungsten silicide, platinum silicide, cobalt silicide and tantalum silicide layers.

13. The method of claim 12 wherein the metal silicide layer is from about 400 to about 700 angstroms thick.

14. The method of claim 8 wherein the first Reactive Ion Etch (RIE) method employs a reactor chamber pressure of from about 250 to about 500 mtorr and a radio frequency power of from about 1200 to about 1500 watts.

15. The method of claim 8 wherein the second Reactive Ion Etch (RIE) method employs a reactor chamber pressure of from about 1500 to about 2000 mtorr and a radio frequency power of from about 1200 to about 1500 watts.

16. An integrated circuit having formed therein a silicon containing insulator layer having formed therethrough a via accessing a metal silicide layer in accord with the method of claim 1.

17. An integrated circuit having formed therein a silicon containing insulator layer having formed therethrough a via accessing a metal silicide layer in accord with the method of claim 8.

* * * * *